United States Patent [19]
Lee

[11] Patent Number: 5,579,192
[45] Date of Patent: Nov. 26, 1996

[54] THYRISTOR POWER CONTROL CIRCUIT

[75] Inventor: Wade Lee, Lafayette, Calif.

[73] Assignee: Larry C. Y. Lee, Hayward, Calif.

[21] Appl. No.: 266,008

[22] Filed: Jun. 27, 1994

[51] Int. Cl.$^6$ ...................................................... H02H 7/00
[52] U.S. Cl. .......................... 361/18; 361/100; 361/115; 307/126; 323/265
[58] Field of Search ................................. 361/18, 93, 91, 361/13, 8, 24, 115, 100; 327/455; 307/125, 126; 323/265

[56] References Cited

U.S. PATENT DOCUMENTS

| | | | |
|---|---|---|---|
| 3,283,177 | 11/1966 | Cooper | 307/252 |
| 4,039,864 | 8/1977 | Tokunaga | 307/252 |

OTHER PUBLICATIONS

"Thyristor Application Notes AN1000, AN1002 and AN1003," Teccor Electronics, Inc., General Catalog–Semiconductors, pp. 103–116.
"A Universal Power Control Circuit for Appliances," Application Note 301, LSI/CSI, Jul. 1989.

Primary Examiner—Jeffrey A. Gaffin
Assistant Examiner—Stephen W. Jackson
Attorney, Agent, or Firm—Elliot B. Aronson

[57] ABSTRACT

A circuit arrangement and method for firing a gated thyristor used for applying electrical power to a load, in response to a trigger signal, from a live power lead and a neutral power lead such as found in the common household electrical service. The load to be energized in response to the trigger signal is connected between the neutral power lead and one of the thyristor main terminals, the other thyristor main terminal being connected to the live power lead. The live power lead is biased at a negative potential with respect to the neutral power lead to define a circuit ground at the negative potential. A gate circuit is connected between the gate terminal and the circuit ground for applying a potential to the gate terminal in response to the trigger signal that is at least as great as the thyristor's characteristic threshold potential for enabling current flow between the thyristor main terminals and thereby energizing the load. The potential applied to the gate terminal is thus negative with respect to the neutral power lead. In one embodiment the gate circuit is provided by a single transistor switched on by the trigger signal and connected in line with a diode and resistor between the gate terminal and the circuit ground.

5 Claims, 1 Drawing Sheet

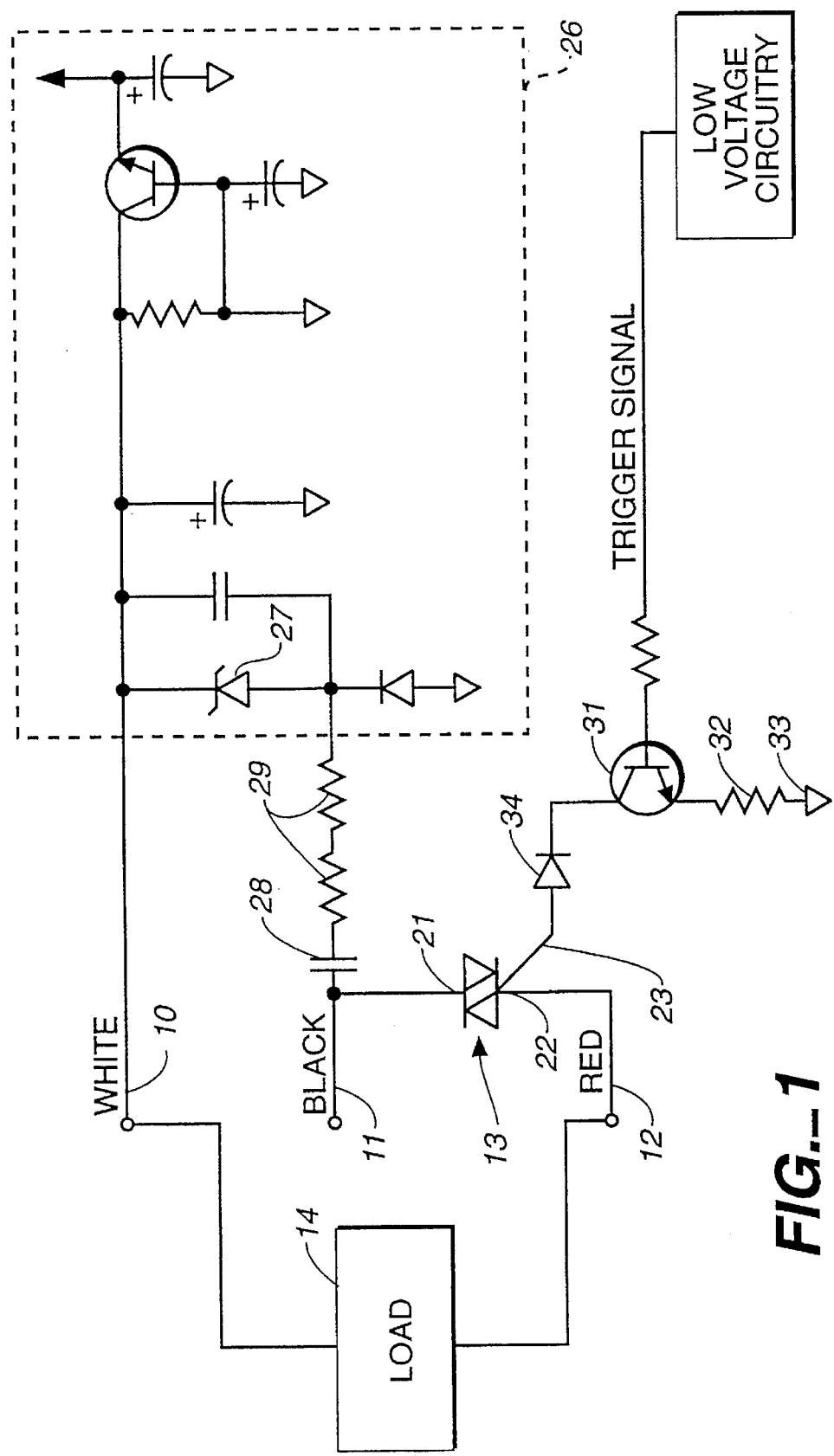
FIG._1

5,579,192

THYRISTOR POWER CONTROL CIRCUIT

BACKGROUND OF THE INVENTION

The present invention relates generally to thyristors used in electronic switching circuits and power controllers and relates more particularly to silicon controlled rectifiers and triacs used as a controlled switch in commercial and household electronic devices for applying power from AC power lines.

Thyristors are integrated-circuit components that are used to control the application of electrical power to a load. In effect, they function as electronic switches. Triacs and silicon controlled rectifiers (SCRs) are varieties of thyristors. The triac functions as a bidirectional alternating-current switch, and the SCR functions as a uni-directional switch permitting rectified current flow in one direction only. Triacs and SCRs are found in many industrial and consumer products in such uses as light dimmers, motor speed controllers, heater controllers, or simply controlled switches for applying electrical power in response to the happening of some event.

The problems addressed by the present invention will be more readily understood if discussed in a specific example. They are illustrated here in the example of a passive infrared (PIR) motion detector, although the same problems and concerns arise in a variety of applications. A PIR motion detector is a device used in automatic light switches and security systems to turn on a light or to activate some other form of alarm or warning indicator when a person or motor vehicle enters a monitored area. Such devices are used with outdoor residential lighting, for example, to illuminate a walkway as a person approaches the front door or to illuminate a driveway as a car approaches.

The PIR motion detector functions by sensing heat in the form of infrared radiation emanating from a person or similarly warm object as the person or object enters or moves about in the field of view of the detector. When the motion detector detects an appropriate heat impulse characteristic of a moving heat source, it provides an electrical signal to activate the light or other alarm. This electrical signal is generally a low-voltage signal, typically on the order of 5 to 15 Volts, that does not carry sufficient power to energize the typical electric lights used for interior or exterior building lighting. Household lighting is generally designed to be energized at 120 Volts. This is the nominal voltage of the electrical service provided by local utility companies throughout the United States. To overcome this deficiency, the low-voltage signal developed by the motion detector (sometimes referred to as a triggering or gating signal) is applied to a switching component, which responds by permitting electric current to flow through the lights at the higher 120-Volt level of the power line. The triac is a common switching component used for this purpose, and the SCR is often used where uni-directional current is desired.

While the triac and the SCR have proven to be reliable and popular switching components in motion detectors and other electronic products, they nevertheless have their limitations. Usually a special firing circuit is needed to "fire" or gate the triac (SCR) so that it conducts at the higher voltage of the power mains. The firing circuit desirably provides a "clean" gating signal that is comparatively insensitive to line fluctuations, noise transients or other irregularities to provide unambiguous triggering of the triac (SCR). In addition, the triac and SCR do not necessarily pass all the power of the line current through to the load. The average power that the triac (SCR) applies to the load depends on when the triac (SCR) is fired during the alternating current cycle. Triac and SCR firing circuits commonly include a phase-control circuit and may also include a zero-crossing detector for establishing a desired phase relationship between the triac (SCR) gate signal and the applied AC line voltage. This phase relationship determines the proportion of the AC waveform (and hence the average power) that is applied to the load per AC cycle.

The need for a triac (SCR) firing circuit ultimately increases cost of the product. More complicated firing circuits generally require a greater number of circuit components and make greater demands on product assembly or are provided by more costly specialized integrated-circuit chips. For low-cost household and consumer products the extra cost of the triac (SCR) firing circuit is significant and increases the price at which the product may be offered to the end user. Nevertheless, in the past the need for special (and often complex) thyristor firing circuits for efficient and reliable thyristor operation could not be avoided.

Another constraint on the use of thyristors is the need for precautions against electrical shock. For a household or commercial product to receive approval from regulatory safety-testing organizations, the 120-Volt line voltage must be properly isolated within the product to prevent injury in the event of a malfunction. Thus, for example, to achieve efficient triac firing while sufficiently isolating the triac firing circuit and the rest of the product's low-voltage circuitry from the 120-Volt line voltage, specialized integrated-circuit triac firing chips have been developed, such as the MOC 3010 optical driver. This chip fires the triac reliably at the desired time (i.e., phase relationship) and provides an optical link between the low and high-voltage circuits that protects quite well against dangerous, undesired electrical connections between the two circuits. The MOC 3010 optical driver chip successfully meets the dual technical demands of reliable, precise triac firing and safety. For use in a low-cost household or commercial product, however, it has the disadvantage of high cost.

SUMMARY OF THE INVENTION

The present invention provides a circuit arrangement and method for firing a gated thyristor such as a triac or SCR that meets the demands of reliable firing and circuit isolation with a comparatively few low-cost circuit components and avoids the need for specialized firing chips such as the MOC 3010, zero-crossing detectors, or other more complicated circuit arrangements previously used.

The circuit arrangement of the invention is used for applying electrical power to a load, in response to a trigger signal, from a live power lead and a neutral power lead such as found in the common household electrical service. Briefly, the circuit arrangement includes a gated thyristor having first and second main terminals and a gate terminal. The load to be energized in response to the trigger signal is connected between the neutral power lead and one of the thyristor main terminals, the other thyristor main terminal being connected to the live power lead. The live power lead is biased at a negative potential with respect to the neutral power lead to define a circuit ground at the negative potential. A gate circuit is connected between the gate terminal and the circuit ground for applying a potential to the gate terminal in response to the trigger signal that is at least as great as the thyristor's characteristic threshold potential for enabling current flow between the thyristor main terminals and thereby energizing the load. The potential applied to the gate terminal is thus negative with respect to the neutral power lead. In one embodiment the gate circuit may be as simple as a single transistor switched on by the trigger signal and connected in line with a diode and resistor between the gate terminal and the circuit ground. This arrangement provides a particularly low cost method for firing the thyristor while providing electrical isolation of the low voltage parts of the apparatus from the power line voltage.

Other aspects, advantages, and novel features of the invention are described below or will be readily apparent to those skilled in the art from the following specifications and drawings of illustrative embodiments.

BRIEF DESCRIPTION OF THE DRAWINGS

FIG. 1 is an electrical circuit schematic diagram showing a triac arrangement according to the invention.

DETAILED DESCRIPTION OF ILLUSTRATIVE EMBODIMENTS

The typical household 120-volt electrical service is provided over two lines, one of which (referred to as the neutral line) is maintained at Earth potential by the local utility company and the other of which is "live" or "hot" with respect to the neutral line. In the circuit arrangement of FIG. 1 lead 10 is a neutral power lead intended to be connected to the neutral, grounded line from the utility company, and lead 11 is a live power lead intended to be connected to the live line from the utility company. Lead 12 is a switched lead, which is connected to live lead 11 according to the invention through gated thyristor 13. In FIG. 1 the leads 10, 11 and 12 are labeled "white," "black" and "red," respectively, which are common colors for these leads in household and commercial products. A load 14 is connected between the neutral and switched leads 10 and 12. In the example of the PIR motion detector described above, the load is provided by the light to be energized when motion is detected. In other applications the load may be provided by a motor, heating element, or such other unit requiring the high-voltage power supply from the utility company. Line 16 carries a low-voltage trigger signal developed by the low-voltage circuitry 17. The triggering signal indicates when load 14 is to be energized. In the above motion detector example, low-voltage circuitry 17 is provided by the circuitry for sensing the motion, conditioning and filtering intermediate electrical signals, and generating the trigger signal indicating that motion has been detected. In other applications the low-voltage circuitry 17 will be appropriate to the functions of the particular application. In typical household and commercial products the low-voltage circuitry operates at a nominal voltage of 5 to 15 volts. In the present context "low-voltage" refers to voltage sufficiently lower than the line voltage applied across load 14 that a governing safety-testing authority would require the low-voltage circuitry to be isolated from the line voltage.

In FIG. 1 thyristor 13 is provided by a triac having first and second main terminals 21 and 22 and a gate terminal 23. The terms "first and second main terminals" are used herein to distinguish the main conduction terminals from the gate terminal. They are used herein to refer also to the anode and cathode terminals of an SCR or other uni-directional thyristor and are generally used in this context without reference to which is the cathode and which is the anode. Those skilled in the art will readily be able to identify the cathode and anode according to the desired SCR polarity. In the embodiment of FIG. 1 thyristor main terminal 21 is connected to live lead 11 and main terminal 22 is connected to the switched live lead 12.

The arrangement of FIG. 1 includes a low-voltage power supply indicated generally at block 26 for supplying power to low-voltage circuitry 17. Unlike the common practice in the past, the low-voltage power supply 26 in FIG. 1 biases the live lead 11 at a low-voltage reference value below the neutral lead 10. This is accomplished in FIG. 1 by Zener diode 27, which is connected between neutral lead 10 and live lead 11 with appropriate polarity to bias live lead 11 at a negative potential with respect to the neutral lead. Specifically, the cathode side of Zener diode 27 is connected to neutral line 10 and the anode side is connected to live lead 11 through current limiting capacitor 28 and resistors 29, which are provided for safety in the event of a short circuit. Although the Zener diode biasing arrangement shown in FIG. 1 is desirable because of its low cost, those skilled in the art will recognize that other voltage regulation methods may also be used for maintaining the live lead at the desired negative reference potential below the neutral lead.

In FIG. 1 the thyristor gate current from gate terminal 23 is controlled by a gate circuit comprising transistor 31 and resistor 32. Transistor 31 is switched between its conducting and blocked states by the low-voltage trigger signal along line 16, which is applied to the base of transistor 31.

In operation, when there is no signal on line 16, transistor 31 is off. No gate current is then present at gate terminal 23, triac 13 is non-conducting, and the switched line 12 is de-energized. When the trigger signal on line 16 goes high, transistor 31 conducts, allowing gate current at gate terminal 23 to short through resistor 32 to the circuit ground at 33. Unlike the common practice in the past, the circuit ground at 33 is actually at the potential of the live line 11, less an insignificant diode junction voltage. In the embodiment of FIG. 1 transistor 31 acts as a current sink. Those familiar with conventional thyristor operation and terminology will recognize that in the circuit arrangement of FIG. 1 the triac is fired in quadrants II and III, and this is accomplished without the need for special phase-shift circuitry.

Normally when gate terminal 23 is conducting, the current generated would be sufficient to destroy the gate circuit-in this case transistor 31, in particular. In the past it has been common to use zero-crossing detectors or phase-control circuitry to shut off the triac firing circuit before it can suffer damage. In the embodiment of FIG. 1 transistor 31 is protected from damage by diode 34 in line with transistor 31. When diode 34 is conducting, transistor 31 is effectively shorted out. The value of resistor 32 is selected to pull sufficient current to fire triac 13, typically on the order of 7.5 milliamperes, without damaging transistor 31. As resistor 32 pulls more current, the potential across the resistor rises to the point where transistor 31 regulates the current level to maintain thyristor conduction.

The specific component values for the various resistors, capacitors and other components shown in FIG. 1 depend on the particular choice of thyristor and trigger signal characteristics as well as the intended operating environment. Determination of appropriate component values for a particular application is well within the ordinary skill in the art and need not be described here.

The arrangement of FIG. 1 has a number of advantages that should now be evident. The need for triac predrivers or similar such controllers is eliminated. The circuit is simplified to the point that the triac firing mechanism is effectively provided by a single transistor and diode. For mass-produced products this can represent a significant savings in cost. Notwithstanding the simplified circuitry, the high-voltage lines are protected from applying a high potential difference across the low-voltage circuitry.

The above descriptions and drawings disclose illustrative embodiments of the invention. Given the benefit of this disclosure, those skilled in the art will appreciate that various modifications, alternate constructions, and equivalents may also be employed to achieve the advantages of the invention. For example, although the single transistor 31 and resistor 32 arrangement of FIG. 1 is particularly simple and cost effective, those skilled in the art will be able to devise other bipolar and field-effect transistor configurations for driving the thyristor gate current according to the invention. In certain applications, particularly for SCR configurations, it may also be desirable to connect the main terminals to the power leads through diodes. In addition, the gating circuitry can be configured to respond to various trigger signal levels and characteristics for more complex levels of control than illustrated herein. Therefore, the invention is not to be limited to the above description and illustrations, but is defined by the appended claims.

What is claimed is:

1. Control circuitry for applying electrical power from a live power lead and a neutral power lead to a load in response to a trigger signal, comprising:

a thyristor having first and second main terminals and a gate terminal, said thyristor having a characteristic threshold potential for enabling current flow between said first and second main terminals, a first of said first and second main terminals being connected to said live power lead, the other of said first and second main terminals being connected to a first side of said load, and said neutral power lead being connected to a second side of said load;

biasing means for biasing said live power lead at a negative potential with respect to said neutral power lead and defining a circuit ground substantially at said negative potential; and gate circuit means connected between said gate terminal and said circuit ground for applying a gate potential at least as great as said characteristic threshold potential to said gate terminal in response to said trigger signal.

2. The apparatus of claim 1 wherein said gate circuit means comprises current sink means for receiving current flow from said gate terminal.

3. The apparatus of claim 2 wherein said current sink means comprises a current sinking transistor and a diode coupled between said gate terminal and said current sinking transistor.

4. The apparatus of claim 1 wherein said gate circuit means comprises a single current sinking transistor, a diode coupled between said gate terminal and said current sinking transistor, and a resistor defining a potential drop thereacross at least as great as said characteristic threshold potential for application to said gate terminal.

5. A method for applying electrical power from a live power lead and a neutral power lead to a load in response to a trigger signal, comprising the steps of:

providing a thyristor having first and second main terminals and a gate terminal, said thyristor having a characteristic threshold potential for enabling current flow between said first and second main terminals;

applying one of said first and second main terminals to said live power lead, applying the other of said first and second main terminals to a first side of said load, and applying said neutral power lead to a second side of said load;

biasing said live power lead at a negative potential with respect to said neutral power lead to define a circuit ground at said negative potential; and applying a gate potential at least as great as said characteristic threshold potential to said gate terminal in response to said trigger signal, said gate potential being negative with respect to said neutral power lead.

* * * * *